US008612840B2

(12) United States Patent
Kehl

(10) Patent No.: US 8,612,840 B2
(45) Date of Patent: Dec. 17, 2013

(54) METHOD FOR DETECTING AN ERROR IN AN A/D CONVERTER BY PARITY PREDICTIONS

(75) Inventor: Natalja Kehl, Obersulm (DE)

(73) Assignee: Robert Bosch GmbH, Stuttgart (DE)

( * ) Notice: Subject to any disclaimer, the term of this patent is extended or adjusted under 35 U.S.C. 154(b) by 330 days.

(21) Appl. No.: 13/068,786

(22) Filed: May 19, 2011

(65) Prior Publication Data

US 2012/0036417 A1 Feb. 9, 2012

(30) Foreign Application Priority Data

May 27, 2010 (DE) .......................... 10 2010 029 345

(51) Int. Cl.
*G06F 11/00* (2006.01)
*H03M 1/00* (2006.01)

(52) U.S. Cl.
USPC ............ 714/800; 714/803; 341/126; 341/155

(58) Field of Classification Search
USPC ......... 714/703, 724, 733, 734, 736, 742, 799, 714/800, 801, 803, 819, 823, 759; 341/94, 341/108, 110, 126, 155, 158, 162
See application file for complete search history.

(56) References Cited

U.S. PATENT DOCUMENTS

| 4,930,127 | A | * | 5/1990 | Abaziou et al. ............... 370/529 |
| 5,040,179 | A | * | 8/1991 | Chen .............................. 714/759 |
| 5,712,633 | A | * | 1/1998 | Bae ................................ 341/120 |
| 2004/0008192 | A1 | * | 1/2004 | Waterman ..................... 345/204 |

OTHER PUBLICATIONS

Chin-Long Wey, Shoba Krishnan and Sondes Sahli: "Test Generation and Concurrent Error Detection in Current-Mode A/D Converters," IEEE, vol. 14, No. 10, Oct. 1995, pp. 1291-1298.
Takashi Matsubara and Yoshiaki Koga: "A Proposal for Error-Tolerating Codes," IEEE, 1993, pp. 130-136.

* cited by examiner

*Primary Examiner* — Christine Tu
(74) *Attorney, Agent, or Firm* — Kenyon & Kenyon LLP

(57) ABSTRACT

For detecting an error of an A/D converter, which is designed to generate at least one digital output signal, which includes a quantity of output data bits, based on at least one analog input signal, and during a conversion, to generate a thermometer code which includes a quantity T of output data values, the detection method includes: ascertaining a first parity directly for the output data bits of the output signal; making a prediction for the output data bits on the basis of the T output data values of the thermometer code; ascertaining a second parity, which is a reverse of the first parity, for the predicted output data bits; and detecting an error for the A/D converter when both the first and second parities are identical.

8 Claims, 2 Drawing Sheets

METHOD FOR DETECTING AN ERROR IN AN A/D CONVERTER BY PARITY PREDICTIONS

BACKGROUND OF THE INVENTION

1. Field of the Invention

The present invention relates to a method and a circuit system for detecting an error in an A/D converter.

2. Description of the Related Art

So-called converters are used for converting electronic signals, and analog signals are converted into digital signals using analog-digital (A/D) converters. Correspondingly, digital-analog (D/A) converters are used to convert digital signals into analog signals. During operation of such converters, errors may arise which are to be detected in order to increase the operational reliability.

Various methods are known in the related art for ensuring the reliability of A/D converters. The use of an alternating logic system is proposed in the publication "Test Generation and Concurrent Error Detection in Current-Mode A/D Converters," IEEE, 1995, by Wey, Chin-Long, Shoba Krishnan, and Sondes Sahli. In this cited document, first a current It1=Iin to be measured is digitized with the aid of an A/D converter and the result is stored in a register, and in the next step a current It2=Iref−Iin is ascertained. The two digital values thus obtained for the currents are then compared to one another. In the error-free case, the second value of current It2 is complementary to the first value of current It1. This method is based on time redundancy; i.e., the clock time of the A/D converter must be equal to or greater than twice the conversion time, so that two conversions can be carried out during a clock period. However, this requirement cannot be met for every application.

In the publication "A Proposal for Error Tolerating Codes," IEEE, 1993, by Takashi Matsubara and Yoshiaki Koga, the use of error-tolerant codes for A/D converters is proposed. A window comparator is used for each bit, the individual window comparators having different voltage ranges. One of the window comparators supplies a logical "1" when the analog input voltage is in a voltage range covered by this window comparator. The outputs of the window comparators are able to implement an error-tolerant code in this way. However, this publication does not state how errors may be detected, or how much additional hardware (HW overhead) is required for this error detection.

BRIEF SUMMARY OF THE INVENTION

Using the method according to the present invention and the circuit system according to the present invention, error detection is carried out by parity prediction in the embodiment, for example, of an analog-digital converter designed as a flash A/D converter, it being possible to detect the errors using comparatively little hardware.

Using the described method, it is possible, among other things, to detect errors of a converter designed as a flash A/D converter. Parity p from a digital output signal of the A/D converter, which includes at least one output data bit or at least one output data value, is computed. In addition, a prediction is made for the reverse, negative parity (not_p) of at least one output data bit d from the thermometer code of the converter. Thus, outputs for errors which are possibly present exist in duplicate in the circuit system.

Using the method, as a rule all errors may be detected whose absolute value |error|>1.5*$U_{LSB}$/$U_{LSB}$ corresponding to a resolution of the A/D converter. So-called logic sharing in the decoder of the converter is not allowed. Accordingly, the method is suitable in an embodiment for A/D converters in which a decoder has its own separate gate circuit as a logical circuit for each output data bit d to be generated, and thus for the digital output signal. A parity prediction and the decoder are implemented according to a special truth table. A signal flow is not interrupted when the method is carried out. A circuit system for carrying out the method requires very little additional hardware. In addition, the parity of the output signal having the at least one output data value d is available for further processing at any time.

In one embodiment, the proposed circuit system is able to detect permanent and transient errors in an A/D converter.

In a converter designed as a flash A/D converter, a serial resistor may be faulty as the possible result of a short circuit, an interruption, or an incorrect value. In addition, a comparator may be faulty. It is also possible for a register or a logic system of the decoder to be faulty.

Depending on the cause of the error, multiple output data bits d, and thus multiple output data values, may be incorrect in the output signal. Using the circuit system, an error detection circuit is provided which detects as many of these errors as possible.

The circuit system according to the present invention is designed to carry out all steps of the proposed method. Individual steps of this method may also be carried out by individual components of the circuit system. In addition, functions of the circuit system or functions of individual components of the circuit system may be carried out as steps of the method. It is also possible for steps of the method to be implemented as functions of at least one component of the circuit system or of the overall circuit system.

DETAILED DESCRIPTION OF THE INVENTION

Figure 1:
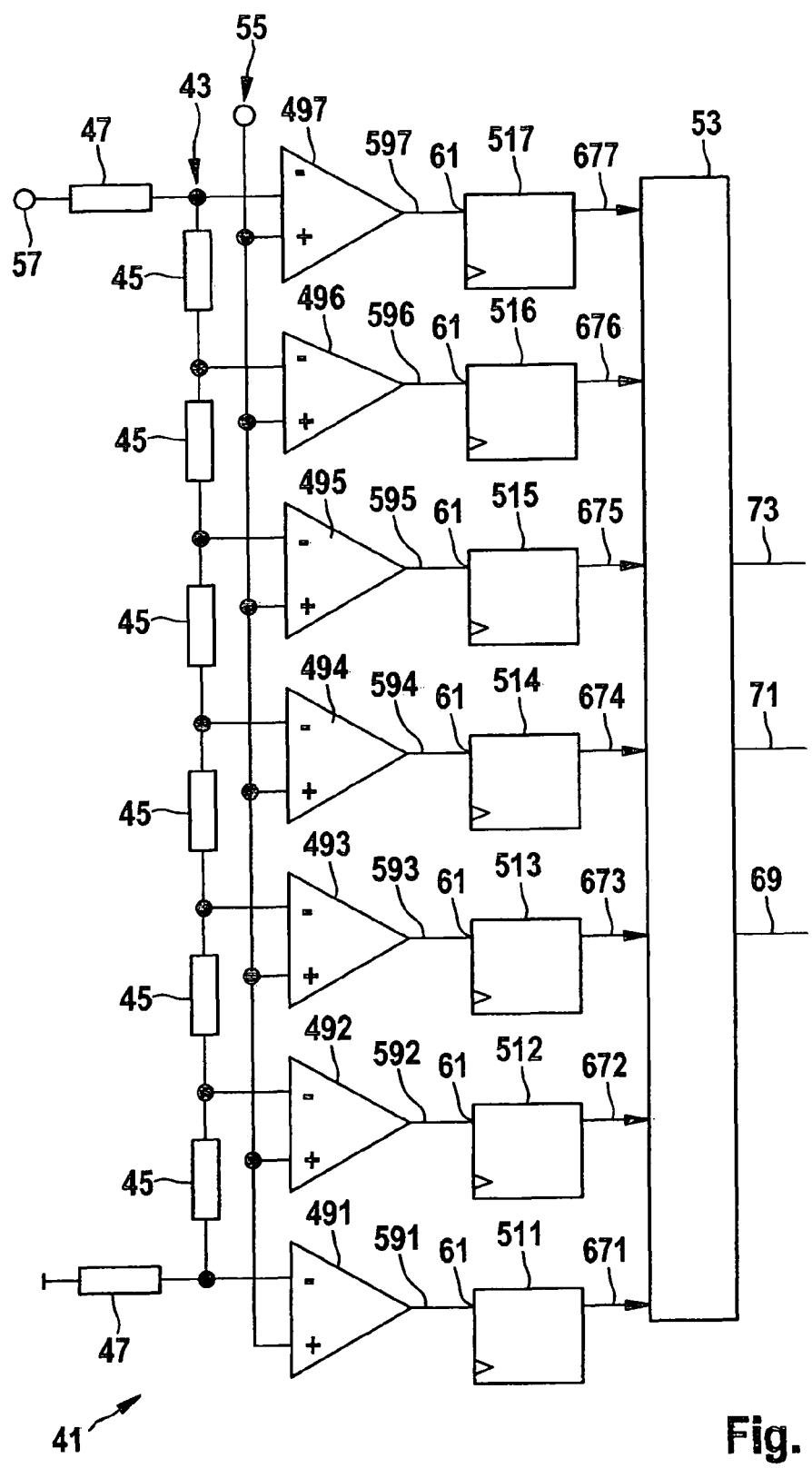
FIG. 1 shows a schematic illustration of one example of an A/D converter designed as a flash A/D converter.

The present invention is schematically illustrated in the drawings on the basis of one example embodiment, and is described in greater detail below with reference to the drawings. The figures are described in an interrelated manner, with identical components being denoted by the same reference numerals.

FIG. 1 shows a schematic illustration of one specific embodiment of an A/D converter 41 designed as a flash A/D converter, having a voltage divider 43 which includes six first resistors 45, designed as series resistors, having resistance values R and connected in series, and two resistors 47, designed as input resistors, each having a resistance value R/2. A/D converter 41 also has seven comparators 491, 492, 493, 494, 495, 496, 497, seven memory elements 511, 512, 513, 514, 515, 516, 517, and a decoder 53.

Using A/D converter 41 schematically illustrated in FIG. 1, an analog input signal, in the present case an input voltage $U_{in}$ 55, which is applied at positive inputs of comparators 491, 492, 493, 494, 495, 496, 497, may be digitized. A reference voltage $U_{ref}$ 57 is applied at voltage divider 43. Reference voltage 57 divided via resistors 45, 47 is applied at negative inputs of comparators 491, 492, 493, 494, 495, 496, 497.

In addition, a first comparator state k1 591 is provided at an output of a first comparator 491, a second comparator state k2 592 is provided at an output of a second comparator 492, a third comparator state k3 593 is provided at an output of a third comparator 493, a fourth comparator state k4 594 is provided at an output of a fourth comparator 494, a fifth comparator state k5 595 is provided at an output of a fifth comparator 495, a sixth comparator state k6 596 is provided at an output of a sixth comparator 496, and a seventh comparator state k7 597 is provided at an output of a seventh comparator 497. These comparator states 591, 592, 593, 594, 595, 596, 597 may be referred to as output signals of comparators 491, 492, 493, 494, 495, 496, 497, respectively.

These provided comparator states 591, 592, 593, 594, 595, 596, 597 are supplied to first inputs 61 (1D) of memory elements 511, 512, 513, 514, 515, 516, 517.

In a further continuation of the A/D conversion, decoder 53 is supplied with a first T output data value x1 671 by an output Q of first memory element 511, a second T output data value x2 672 by an output Q of second memory element 512, a third T output data value x3 673 by an output Q of third memory element 513, a fourth T output data value x4 674 by an output Q of fourth memory element 514, a fifth T output data value x5 675 by an output Q of a fifth memory element 515, a sixth T output data value x6 676 by an output Q of a sixth memory element 516, and a seventh T output data value x7 677 by an output Q of a seventh memory element 517. These referenced thermometer code or T output data values x1, x2, x3, x4, x5, x6, x7 (671, 672, 673, 674, 675, 676, 677, respectively) form a so-called thermometer code within A/D converter 41, and may also be referred to as output signals of the thermometer code.

Three output data bits d0, d1, d2 (69, 71, 73, respectively), i.e., output data values, are then provided by decoder 53, which form a digital output signal of A/D converter 41. A zero$^{th}$ output data bit d0 69 stands for a zero$^{th}$ power of the number 2, a first output data bit d1 71 stands for a first power of the number 2, and a second digital output data bit d2 73 stands for a second power of the number 2. Overall, output data bits d0, d1, d2 (69, 71, 73, respectively) form a digital output signal of A/D converter 41.

Analog-digital converters such as A/D converter 41 from FIG. 1 are used to convert analog input signals into digital numerical values as output data bits d0, d1, d2 (69, 71, 73, respectively). These values may then be stored and further processed. The digital output signal of width N, which includes output data bits d0, d1, d2 (69, 71, 73, respectively), is proportional to analog input voltage $U_{in}$, taking sampling and quantization effects into account:

$$s \frac{U_{in}}{U_{LSB}} = \frac{d_{max}}{U_{ref}} U_{in} \quad (1)$$

together with $$U_{LSB} = \frac{U_{ref}}{d_{max}} \quad (2)$$

In the present case, voltage $U_{LSB}$ is the resolution of A/D converter 41. A/D converter 41 from FIG. 1, having a width N=3 of the output signal, is structured according to the parallel conversion principle, and includes the seven comparators 491, 492, 493, 494, 495, 496, 497, voltage divider 43 having eight resistors 45, 47, and seven memory elements 511, 512, 513, 514, 515, 516, 517, which generate the so-called thermometer code. The thermometer code includes the seven thermometer code or T output data values x1, x2, x3, x4, x5, x6, x7 (671, 672, 673, 674, 675, 676, 677, respectively). Decoder 53 is used to further process T output data values x1, x2, x3, x4, x5, x6, x7 (671, 672, 673, 674, 675, 676, 677, respectively), decoder 53 including for each output data bit d0, d1, d2 (69, 71, 73, respectively), i.e., for each output data value, at least one logical circuit, i.e., one logical gate circuit or one logical gate, via which only one of output data bits d0, d1, d2 (69, 71, 73, respectively) is converted in each case.

Thus, output data values x1, x2, x3, x4, x5, x6, x7 (671, 672, 673, 674, 675, 676, 677, respectively) of the thermometer code are converted by decoder 53 into the output signal, designed as a binary number, having three output data bits d0, d1, d2 (69, 71, 73, respectively).

Table 1 shows the relationship between input voltage $U_{in}$ 55, comparator states k1, k2, k3, k4, k5, k6, k7 (591, 592, 593, 594, 595, 596, 597, respectively), and the binary values as output data values d0, d1, d2 (69, 71, 73, respectively) for A/D converter 41 from FIG. 1. The proposed method for error detection is usually suitable for parallel A/D converter 41 from FIG. 1.

TABLE 1

Relationship between input voltage 55, comparator states k1, k2, k3, k4, k5, k6, k7 (591, 592, 593, 594, 595, 596, 597, respectively), and output data bits d0, d1, d2 (69, 71, 73, respectively) for A/D converter 41 from FIG. 1

| Input voltage | Comparator states | | | | | | | Output data bit | | |
|---|---|---|---|---|---|---|---|---|---|---|
| $U_{in}$ in V | k7 | k6 | k5 | k4 | k3 | k2 | k1 | d2 | d1 | d0 |
| 0 | 0 | 0 | 0 | 0 | 0 | 0 | 0 | 0 | 0 | 0 |
| 1 | 0 | 0 | 0 | 0 | 0 | 0 | 1 | 0 | 0 | 1 |
| 2 | 0 | 0 | 0 | 0 | 0 | 1 | 1 | 0 | 1 | 0 |
| 3 | 0 | 0 | 0 | 0 | 1 | 1 | 1 | 0 | 1 | 1 |
| 4 | 0 | 0 | 0 | 1 | 1 | 1 | 1 | 1 | 0 | 0 |
| 5 | 0 | 0 | 1 | 1 | 1 | 1 | 1 | 1 | 0 | 1 |
| 6 | 0 | 1 | 1 | 1 | 1 | 1 | 1 | 1 | 1 | 0 |
| 7 | 1 | 1 | 1 | 1 | 1 | 1 | 1 | 1 | 1 | 1 |

Figure 2:
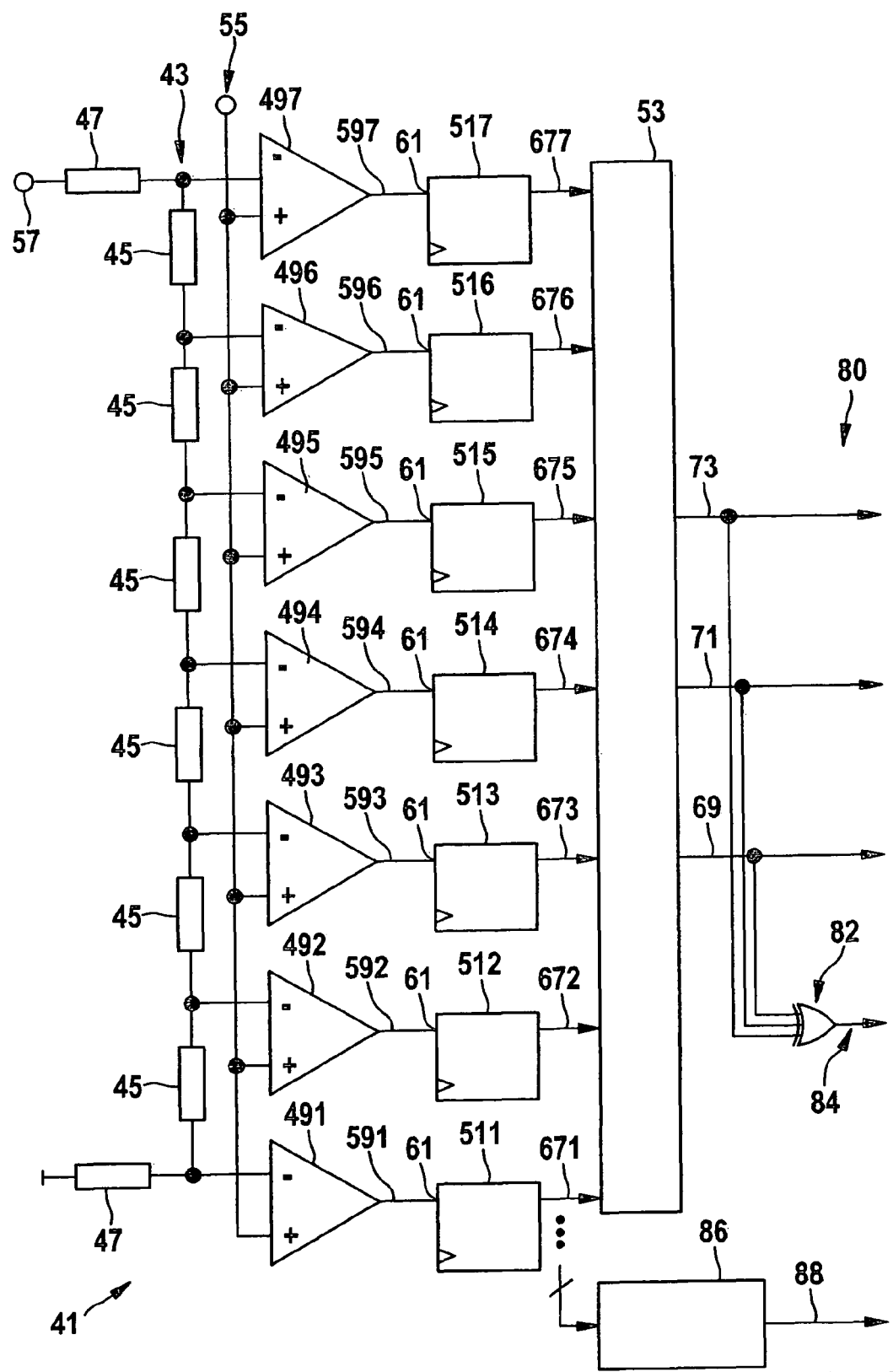
FIG. 2 shows a schematic illustration of one specific embodiment of a circuit system according to the present invention for detecting errors in the flash A/D converter from FIG. 1, by parity prediction.

The described circuit 80 for error detection is schematically illustrated in FIG. 2, in addition to A/D converter 41 previously described for FIG. 1. Circuit system 80 includes an XOR gate 82, i.e., an exclusive OR gate which may also be referred to as an EITHER-OR gate. In the described specific embodiment, XOR gate 82 includes three inputs which are connected to outputs of decoder 53. For carrying out the method according to the present invention, the three output data bits d0, d1, d2 (69, 71, 73, respectively), which form the digital output signal of A/D converter 41, are supplied to XOR gate 82. An XOR data value, i.e., a first parity 84, which is formed as the result of XOR gate 82 from the three output data bits d0, d1, d2 (69, 71, 73, respectively) of decoder 53, represents parity 84 of the output signal, and thus, a first parity 84 ascertained within the scope of the method. The XOR data value and thus parity 84 is equal to zero when output data bits d0, d1, d2 (69, 71, 73, respectively) have no "1"s or have an even number of "1"s, i.e., when output data bits d0, d1, d2 (69, 71, 73, respectively) in the present specific embodiment of the method include no "1" or two "1"s. Otherwise, i.e., for one "1" or three "1"s, parity 84 is equal to one.

Circuit system 80 also includes a module 86 for carrying out a parity prediction, the input of the module being connected to the outputs of memory elements 511, 512, 513, 514,

515, 516, 517. During an A/D conversion, the module is supplied with T output data values x1, x2, x3, x4, x5, x6, x7 (671, 672, 673, 674, 675, 676, 677, respectively) of memory elements 511, 512, 513, 514, 515, 516, 517, respectively, which as a whole form the thermometer code. This module 86 is used to provide a second parity 88 which is ascertained for first parity 84, in the present case, by XOR gate 82. With the aid of the specific embodiment of the method described here, a prediction is made for output data bits d0, d1, d2 (69, 71, 73, respectively), using module 86 for carrying out the parity prediction, on the basis of T output data values x1, x2, x3, x4, x5, x6, x7 (671, 672, 673, 674, 675, 676, 677, respectively) of the thermometer code. Based on predicted output data bits d0, d1, d2 (69, 71, 73, respectively), a second parity 88 is determined within the scope of the method which is reversed, i.e., inverted, with respect to first parity 84, so that second parity 88 is the negative parity of output data bits d0, d1, d2 (69, 71, 73, respectively) predicted on the basis of T output data values x1, x2, x3, x4, x5, x6, x7 of the thermometer code. Alternatively, first parity 84 may be a negative parity, and second parity 88 may be a positive parity.

Thus, based on the thermometer code, module 86 is used to provide a prediction for negative, second parity 88 (not_p) of the output signal, which includes output data values d0, d1, d2. In addition, actual, i.e., positive, first parity p 84 of the output signal is computed with the aid of XOR gate 82. In the error-free case, the signals of first parity p 84 and of second parity not_p 88 are not equal. If first parity 84 is equal to second parity 88, an error is present for the A/D conversion. Thus, error detection is carried out in a two-fold manner according to the two-rail principle.

In order for the described circuit system 80 to have the required properties for detecting errors, it is provided that decoder 53 and the parity prediction for providing second parity 88 are implemented according to a specified truth table. In addition, no logic sharing is used in decoder 53; i.e., in the present case output data bits d0, d1, d2 (69, 71, 73, respectively), and thus the output signal, are computed without a shared gate circuit, and thus using separate logical circuits, usually separate gates. Under this condition, in the event of an individual internal error in decoder 53, a maximum of one output data bit d0, d1, d2 (69, 71, 73, respectively) in the output signal is incorrect.

These errors are detected by the parity check. Table 2 shows the relationships between input voltage $U_{in}$ 55, output data values x1, x2, x3, x4, x5, x6, x7 (671, 672, 673, 674, 675, 676, 677, respectively) of the thermometer code, output data bits d0, d1, d2 (69, 71, 73, respectively) of decoder 53, and parities 84, 88 of the corresponding truth table. According to this truth table, the prediction of negative, second parity 88 is formed from the inverse value of first parity 84; i.e., the prediction for negative, second parity 88 is "0" when first parity 84 is "1," and the prediction for negative, second parity 84 is "1" when first parity 84 is "0."

TABLE 2

Truth table for decoder 53 and the parity prediction

| Uin | x7 | x6 | x5 | x4 | x3 | x2 | x1 | d2 | d1 | d0 | p | not_p (prediction) |
|---|---|---|---|---|---|---|---|---|---|---|---|---|
| 0 | 0 | 0 | 0 | 0 | 0 | 0 | 0 | 0 | 0 | 0 | 0 | 1 |
| 1 | 0 | 0 | 0 | 0 | 0 | 0 | 1 | 0 | 0 | 1 | 1 | 0 |
| 2 | 0 | 0 | 0 | 0 | 0 | 1 | 1 | 0 | 1 | 0 | 1 | 0 |
| 3 | 0 | 0 | 0 | 0 | 1 | 1 | 1 | 0 | 1 | 1 | 0 | 1 |
| 4 | 0 | 0 | 0 | 1 | 1 | 1 | 1 | 1 | 0 | 0 | 1 | 0 |
| 5 | 0 | 0 | 1 | 1 | 1 | 1 | 1 | 1 | 0 | 1 | 0 | 1 |

TABLE 2-continued

Truth table for decoder 53 and the parity prediction

| Uin | x7 | x6 | x5 | x4 | x3 | x2 | x1 | d2 | d1 | d0 | p | not_p (prediction) |
|---|---|---|---|---|---|---|---|---|---|---|---|---|
| 6 | 0 | 1 | 1 | 1 | 1 | 1 | 1 | 1 | 1 | 0 | 0 | 1 |
| 7 | 1 | 1 | 1 | 1 | 1 | 1 | 1 | 1 | 1 | 1 | 1 | 0 |
| — | u | u | u | u | u | u | u | 0 | 0 | 0 | 0 | 0 |

The entry "u" in Table 2 means that an output data value x1, x2, x3, x4, x5, x6, x7 (671, 672, 673, 674, 675, 676, 677, respectively) of the thermometer code is an invalid code word. In this case, p=not_p=0 applies for parities 84, 88, and therefore an error is reported. This means that an individual error in comparators 491, 492, 493, 494, 495, 496, 497 or memory elements 511, 512, 513, 514, 515, 516, 517 results in either a valid code word, in which an absolute value of an error is less than $1.5*U_{LSB}$, or an invalid code word, which, however, is also recognized as invalid.

Possible permanent errors which may occur in A/D converter 41 in FIG. 2 are summarized in Table 3. Table 3 is also used to make a statement concerning the detection of these errors.

TABLE 3

Possible errors in A/D converter 41 and their detection

| Type of error | Error detection |
|---|---|
| For a resistor $R_i$ 45, 47, $R_i$ = 0 | The following applies for the absolute value of all errors: $\|Error\| < 1.5\ U_{LSB}$ |
| For a resistor $R_i$ 45, 47, $R_i$ = 2*R | The following applies for the absolute value of all errors: $\|Error\| < 1.5\ U_{LSB}$ |
| For a resistor $R_i$ 45, 47 $R_i$ = 0.5*R | The following applies for the absolute value of all errors: $\|Error\| < 1.5\ U_{LSB}$ |
| Interruption at a resistor 45, 47 | Not detected for all $R_i$. Approach: implement $R_i$ using two parallel resistors |
| Stuck-at-1 error and therefore error of a logical component (gate) at a comparator state k1, k2, k3, k4, k5, k6, k7 or T output data value x1, x2, x3, x4, x5, x6, x7 | The following applies for the absolute value of all errors: $\|Error\| < 1.5\ U_{LSB}$ |
| Stuck-at-0 error and therefore error of a logical component (gate) at a comparator state k1, k2, k3, k4, k5, k6, k7 or T output data value x1, x2, x3, x4, x5, x6, x7 | All errors are detected for which the following applies for their absolute value: $\|Error\| > 1.5\ U_{LSB}$ |
| Individual error in decoder 53 | All errors are detected |
| Error in XOR gate 82 | Detected |
| Individual error in module 86 for parity prediction | All errors are detected |

For carrying out the proposed specific embodiment of the method, all permanent errors whose absolute value $\|error\|>1.5*U_{LSB}$ are detected except for an interruption at a resistor $R_i$ 45, 47. However, this problem may be addressed by implementing each resistor $R_i$ 45, 47 within A/D converter 41 as two parallel resistors. For transient errors, it likewise applies that all errors for which $\|error\|>1.5*U_{LSB}$ are detected, provided that the transient pulse has a significant duration.

Little additional hardware is necessary for the described embodiment of the present invention. Thus, the method requires very little HW overhead, the signal flow is not interrupted, and the parity of output data bits d0, d1, d2 (69, 71, 73, respectively) is always available for further signal processing.

The present invention is usually suitable for all electronic circuits having parallel A/D converters, for example also for safety-critical applications, such as ASICs, for example, which provide information for functions such as ABS or ESP in the motor vehicle.

What is claimed is:

1. A method for detecting an error of an analog-to-digital converter configured to generate at least one digital output signal, which includes a plurality of output data bits, based on at least one analog input signal, comprising:
   generating, during an analog-to-digital conversion, a thermometer code which includes a quantity T of output data values;
   directly generating a first parity for actual values of the output data bits of the output signal;
   providing predicted values for the output data bits of the output signal, on the basis of the quantity T of output data values of the thermometer code;
   generating a second parity for the predicted values of the output data bits of the output signal, wherein the second parity is an inverse of the first parity in the case of error-free state of the analog-to-digital converter; and
   detecting an error for the analog-to-digital converter if both the first and second parities are identical.

2. The method as recited in claim 1, wherein a positive parity is generated as the first parity for the actual values of the output data bits, and a negative parity is generated as the second parity for the predicted values of the output data bits.

3. The method as recited in claim 2, wherein during the analog-to-digital conversion, the output signal is generated on the basis of the thermometer code with the aid of a decoder.

4. The method as recited in claim 2, wherein each output data bit of the output signal is computed using a separate logical circuit.

5. The method as recited in claim 2, wherein the generating of the thermometer code having the quantity T of output data values comprises:
   supplying the at least one analog input signal to a voltage divider;
   supplying outputs of the voltage divider as intermediate results to comparators, wherein comparator states are formed by the comparators as signals on the basis of the intermediate results;
   supplying the signals for the comparator states to a memory element; and
   forming the thermometer code having the quantity T of output data values as a function of the signals for the comparator states output from the memory element.

6. A detection circuit system for detecting an error of an analog-to-digital converter configured to generate at least one digital output signal, which includes a plurality of output data bits, based on at least one analog input signal, and further configured to generate, during an analog-to-digital conversion, a thermometer code which includes a quantity T of output data values, the detection circuit system comprising:
   an XOR gate configured to directly generate a first parity for actual values of the output data bits of the output signal;
   a computation module configured to:
      provide predicted values for the output data bits of the output signal, on the basis of the quantity T of output data values of the thermometer code; and
      generate a second parity for the predicted values of the output data bits of the output signal, wherein the second parity is an inverse of the first parity in the case of error-free state of the analog-to-digital converter; and
   a comparison unit configured to compare the first and second parities and determine an error for the analog-to-digital converter if both the first and second parities are identical.

7. The circuit system as recited in claim 6, wherein the analog-to-digital converter includes a decoder having outputs outputting the at least one digital output signal, and wherein the XOR gate is connected to the outputs of the decoder and configured to determine the first parity from the at least one output digital signal provided via the outputs of the decoder.

8. The circuit system as recited in claim 7, wherein the computation module computes the second parity for the predicted output data bits from the quantity T of output data values.

* * * * *